United States Patent [19]
Smith et al.

[11] Patent Number: 5,469,104
[45] Date of Patent: Nov. 21, 1995

[54] ACTIVE FOLDED CASCODE

[75] Inventors: Douglas S. Smith, Scotts Valley; Edward C. Bee, San Jose, both of Calif.

[73] Assignee: Elantec, Inc., Milipitas, Calif.

[21] Appl. No.: 218,726

[22] Filed: Mar. 28, 1994

[51] Int. Cl.$^6$ ............................ H03F 1/22; H03F 1/56
[52] U.S. Cl. ..................... 327/491; 327/482; 327/541; 327/563; 330/253; 330/311
[58] Field of Search ........................ 330/311, 253; 327/252, 538, 541, 542, 543, 563, 389, 478, 482, 491, 215, 223, 439, 440, 108; 326/89, 124

[56] References Cited

U.S. PATENT DOCUMENTS

| | | | |
|---|---|---|---|
| 4,507,573 | 3/1985 | Nagano | 327/542 |
| 4,767,945 | 8/1988 | Quinn | 327/563 |
| 4,777,472 | 10/1988 | Sauer et al. | 330/311 |
| 4,891,604 | 1/1990 | Cotreau | 330/252 |
| 5,012,201 | 4/1991 | Morita et al. | 330/252 |
| 5,034,626 | 7/1991 | Pirez et al. | 327/542 |
| 5,045,808 | 9/1991 | Taylor | 330/311 |
| 5,243,240 | 9/1993 | Murakami et al. | 327/246 |

Primary Examiner—Timothy P. Callahan
Assistant Examiner—Terry L. Englund
Attorney, Agent, or Firm—Leo V. Novakoski

[57] ABSTRACT

An active folded cascode includes an amplifier transistor and a source follower transistor configured as a folded cascode with the drain of the amplifier transistor and the source of the follower transistor connected to form a gain node. A feedback transistor has its gate and drain connected to the source and gate of the follower transistor while bias current provided to the drain of the feedback transistor by a current source maintains the gain node at a fixed voltage with respect to a reference voltage. Coupling of the voltage at the gain node to the gate of the source follower transistor by the feedback transistor reduces the effective source impedance of the source follower transistor, providing improved gain and bandwidth properties for the active folded cascode circuit.

10 Claims, 15 Drawing Sheets

ACTIVE FOLDED CASCODE

BACKGROUND OF THE INVENTION

1. Technical Field

The present invention relates to folded cascode circuits and in particular to a folded cascode circuit including feedback for improved impedance, gain, and bandwidth characteristics.

2. Description of the Related Art

Amplifier circuits may include cascode connected transistors to limit variations in collector current with collector voltage (the Early effect) and to reduce the degradation in amplifier performance at high signal frequencies (the Miller effect). Folded cascode circuits may be implemented with either field effect transistors (FETs) or bipolar transistors. Therefore, in order to keep the discussion general, the drain (collector), gate (base), and source (emitter) electrodes of a field effect (bipolar) transistor are referred to as the first, second, and third electrodes, respectively. In both cases, transistors comprising the folded cascode circuit operate in their active regions, so that the first and third electrodes of each transistor are reverse biased and forward biased, respectively, relative to the corresponding second electrode.

In a conventional cascoded amplifier circuit, the first electrode of an amplifier transistor forms a gain node which is connected to the third electrode of a second transistor. The second transistor is connected as a follower with respect to a bias voltage, and bias current provided to the gain node by a current source is divided between the amplifier transistor and the follower transistor according to a signal applied to the second electrode of the amplifier transistor. Output signals taken from the first electrode of the follower transistor accurately reflect the input signal only to the extent that the current at the first electrode of the follower transistor is determined solely by the input signal.

The follower transistor holds the voltage at the first electrode of the amplifier transistor fixed relative to the bias voltage. This reduces variations in the first electrode current of the amplifier transistor due to the Early effect and, consequently, reduces variations in the output current with the voltage at the gain node. For high frequency input signals, coupling between input signals and the gain node by the capacitance of the junction between the second and first electrodes is also reduced.

The actual improvement in the performance of cascoded amplifier circuits depends on the output impedances of the current source and amplifier transistor relative to the impedance looking into the third electrode of the follower transistor. The follower transistor is employed specifically because the third electrode of the follower transistor (source or emitter depending on the device type) provides a low impedance input for current from the gain node. However, unless the combined output impedance of the current source in parallel with the first electrode of the amplifier transistor is substantially greater than the impedance looking into the third electrode of the follower transistor, the current into the follower transistor will be a function of the voltage at the gain node. This dependence leads to limitations on the gain and bandwidth of the amplifier associated with the Early and Miller effects, respectively. The output of the current source can be cascoded to increase its output impedance. However, this approach does nothing to reduce the impedance of the third electrode of the follower transistor or improve (increase) the impedance of the amplifier transistor. In addition, it limits the compliance of the amplifier by holding the voltage of the third electrode of the follower transistor further from the reference voltage supply.

SUMMARY OF THE INVENTION

An active folded cascode circuit is disclosed that incorporates a modified follower circuit having improved impedance characteristics to enhance the gain and bandwidth of the folded cascode circuit. The modified follower circuit comprises a follower transistor, the second and third electrodes of which correspond to the input and output, respectively, of a conventional follower circuit, a feedback transistor having its first and second electrodes connected to the second and third electrodes, respectively, of the modified follower transistor, and a first current source connected between a first reference voltage and the first electrode of the feedback transistor to bias the feedback transistor into the active region. The third electrode of the feedback transistor is connected to a second reference voltage. The feedback transistor couples a sample of the voltage at the third electrode of the follower circuit back to the second electrode of the follower transistor, effectively reducing the impedance of the third electrode of the follower transistor. The first electrode of the follower transistor forms a high impedance current output for the modified follower circuit.

The active folded cascode circuit is formed by coupling the first electrode of an amplifier transistor to the third electrode of the follower transistor, so that the first electrode of the follower transistor and the second electrode of the amplifier transistor form the output and input, respectively, of the active folded cascode circuit. A second current source connected between the second reference voltage and the first electrode of the amplifier transistor provides biasing current to the amplifier transistor and output current to the follower transistor.

Bias current from the first current source maintains a forward bias voltage between the second and third electrodes of the feedback transistor, holding the third electrode of the follower transistor at a nominally fixed voltage relative to the second reference voltage. Feedback coupled from the output to the input of the follower circuit by the feedback transistor effectively reduces the output impedance of the follower transistor, i.e. the impedance looking into its third electrode, by an amount determined by the product of the transconductance gain of the feedback transistor and the impedance looking into its first electrode. As a result, the impedance of the third electrode of the follower transistor is substantially reduced, reducing the dependence of the output current of the active folded cascode circuit on the voltage at the first electrode of the amplifier transistor.

Active folded cascode circuits in accordance with the present invention may be realized using FETs or bipolar transistors of either N or P conductivity types. Active folded cascode circuits in accordance with the present invention may also be implemented in fully differential form using either FIit or bipolar devices. Further, the improved follower circuit may be incorporated in other transistor circuits requiring especially low impedance nodes.

DETAILED DESCRIPTION OF THE INVENTION

Figure 1:
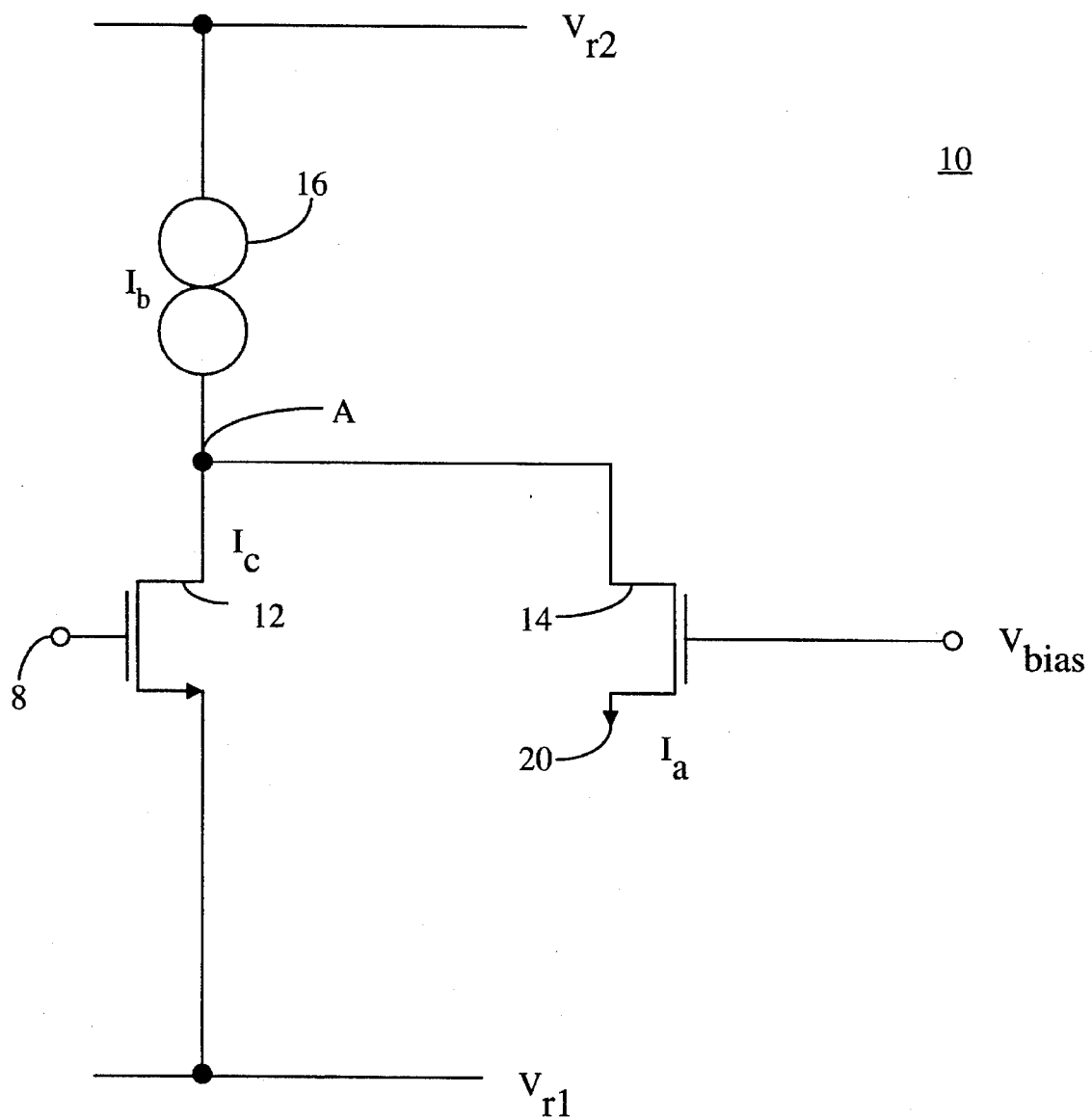
FIG. 1 is a schematic diagram of a conventional folded cascode circuit.

Referring to FIG. 1, there is shown a conventional folded cascode circuit 10, including an amplifier transistor 12, a follower transistor 14, and a current source 16. The second electrode of amplifier transistor 12 and the first electrode of follower transistor 14 form an input 8 and output 20, respectively, of folded cascode circuit 10. Current source 16 is connected between the first electrode of amplifier transistor 12 and a reference voltage, $V_{r2}$, to provide bias current to amplifier transistor 12. The third electrode of follower transistor 14 is connected to the first electrode of amplifier transistor 12, which forms gain node A. Follower transistor 14 has its second electrode connected to a bias voltage, $V_{bias}$, and functions as a follower with respect to $V_{bias}$ to hold node A at a fixed voltage with respect to $V_{bias}$.

In conventional folded cascode circuit 10, bias current, $I_b$, from current source 16 is distributed between the first electrode current of amplifier transistor 12 and the third electrode of follower transistor 14 according to a signal applied to input 8 of folded cascode circuit 10 so that $I_o = I_b - I_c$. Here, $I_o$ is the current at output 20 and $I_c$ is the first electrode current for amplifier transistor 12. Unless the output impedance of current source 16 in parallel with the output impedance of amplifier transistor 12 is much greater than the impedance looking into the third electrode of follower transistor 14, $I_o$ will be a function of the voltage at node A. Current sources 16 come in many forms, including resistors in series with voltage sources, biased transistors, and various forms of current mirrors, and have a variety of output impedances. Consequently, the performance of conventional cascode circuit 10 will vary, depending on the current source 16 selected. Cascoding the output of transistor-based current sources 16 increases this output impedance, but does nothing to reduce the third electrode impedance of follower transistor 14. Nor does it improve the output impedance of the first electrode of amplifier transistor 12.

Figure 2:
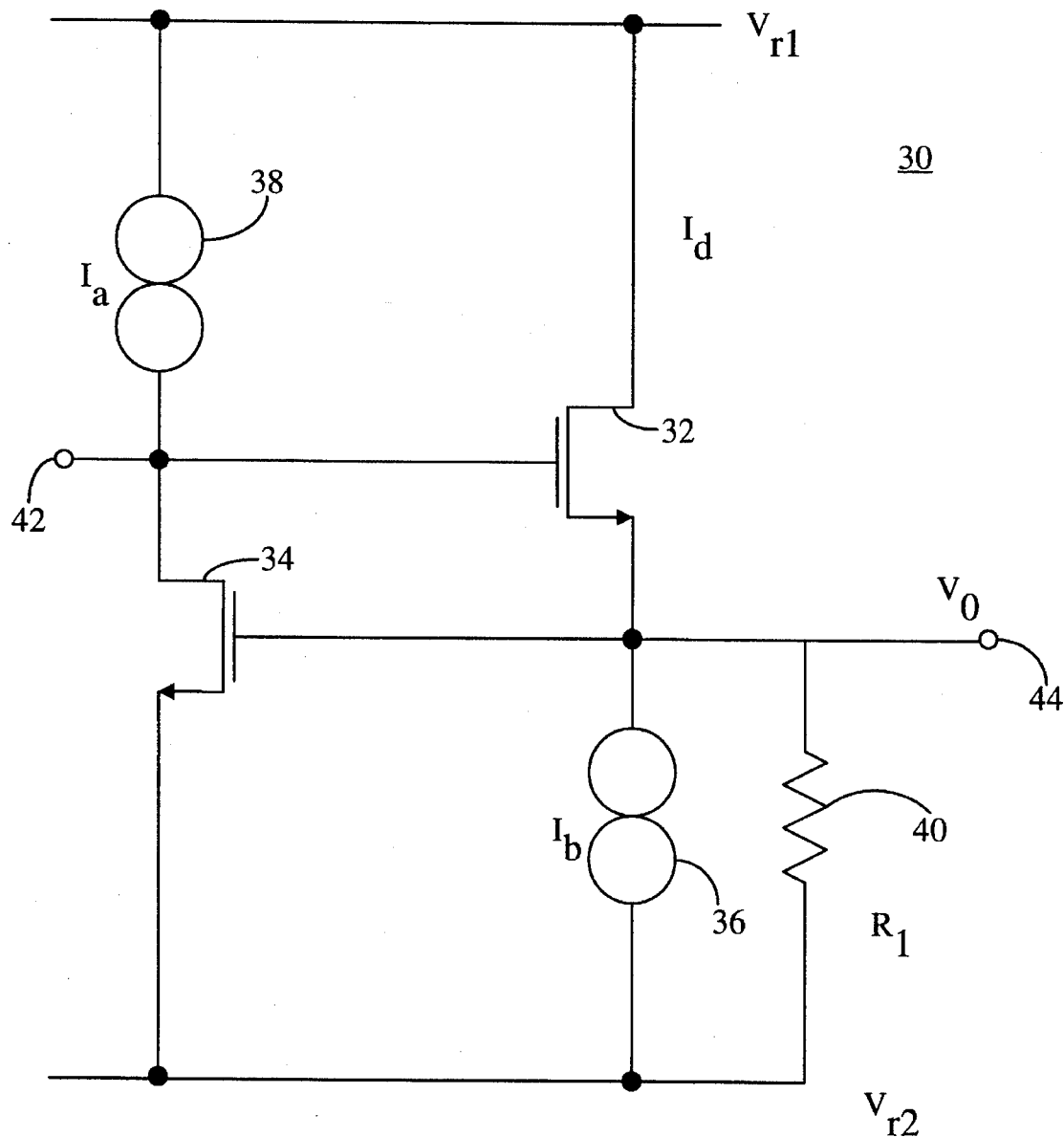
FIG. 2 is a schematic diagram of an N-type follower circuit in accordance with the present invention.

Referring now to FIG. 2, there is shown a follower circuit 30, including a follower transistor 32, a feedback transistor 34, and first and second current sources 36 and 38, respectively: Follower transistor 32 has its first electrode connected to $V_{r1}$ and its second electrode and third electrode forming an input 42 and an output 44 for follower circuit 30. Current source 36 provides bias current for follower transistor 32, maintaining it in the active region. Feedback transistor 34 has its second electrode connected to the third electrode of follower transistor 32, its third electrode connected to reference voltage $V_{r2}$, and its first electrode connected to the second electrode of follower transistor 32 and to the output of current source 38. Current source 38 provides bias current to feedback transistor 34 which holds the third electrode of follower transistor 32 at a voltage $V_{23}$ relative to reference voltage $V_{r2}$. $V_{23}$ is the gate-source or base emitter voltage of feedback transistor 34, depending on the device type used. Current source 38 may be as simple as a high value resistor to reduce problems with stray capacitances. A resistor 40 connected between the third electrode of follower transistor 32 and $V_{r2}$ represents the load driven by follower circuit 30.

Feedback transistor 34 couples the voltage at output 44 to input 42 of follower circuit 30. The resulting feedback reduces the impedance looking into the third electrode of follower transistor 32, so that the effective impedance is given by:

$$R_{o1} = [g_{m1}(g_{m2}r_{o2}-1)]^{-1}. \quad \text{(Eq. I)}$$

Here, $g_{m1}$ and $g_{m2}$ are the transconductances of follower transistor 32 and feedback transistor 34 and $r_{o2}$ is the output impedance (impedance looking into the first electrode) of feedback transistor 34. Since the impedance looking into the third electrode of follower transistor 32 in the absence of feedback is given by $(g_{m1})^{-1}$, the third electrode impedance of follower transistor 32 is decreased by a factor of $(g_{m2}r_{o2}-1)^{-1}$ through the use of feedback transistor 34.

Figure 3A:
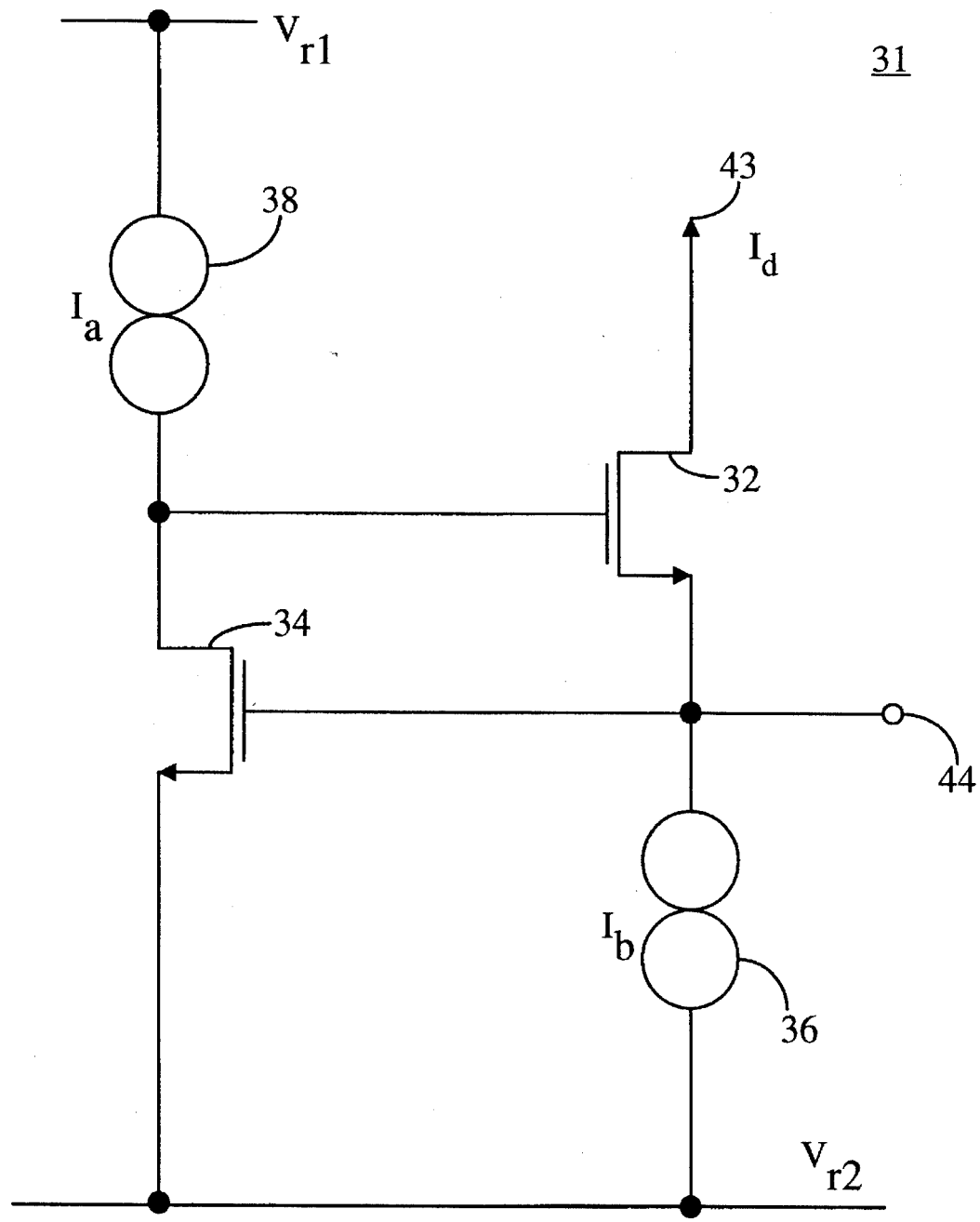
FIG. 3A is a schematic diagram of an N-type modified follower circuit in accordance with the present invention.

Referring now to FIG. 3A, there is shown a modified follower circuit 31 in accordance with the present invention. The first electrode of follower transistor 32 forms a high impedance output 43 of modified follower 31. As discussed in conjunction with FIG. 2, feedback transistor 34 reduces the impedance of the third electrode of follower transistor 32, which forms a low impedance input 44 for modified follower circuit 31. Thus, modified follower circuit 31 provides a current signal at high impedance output 43 in response to a current signal at low impedance input 44.

Figure 3B:
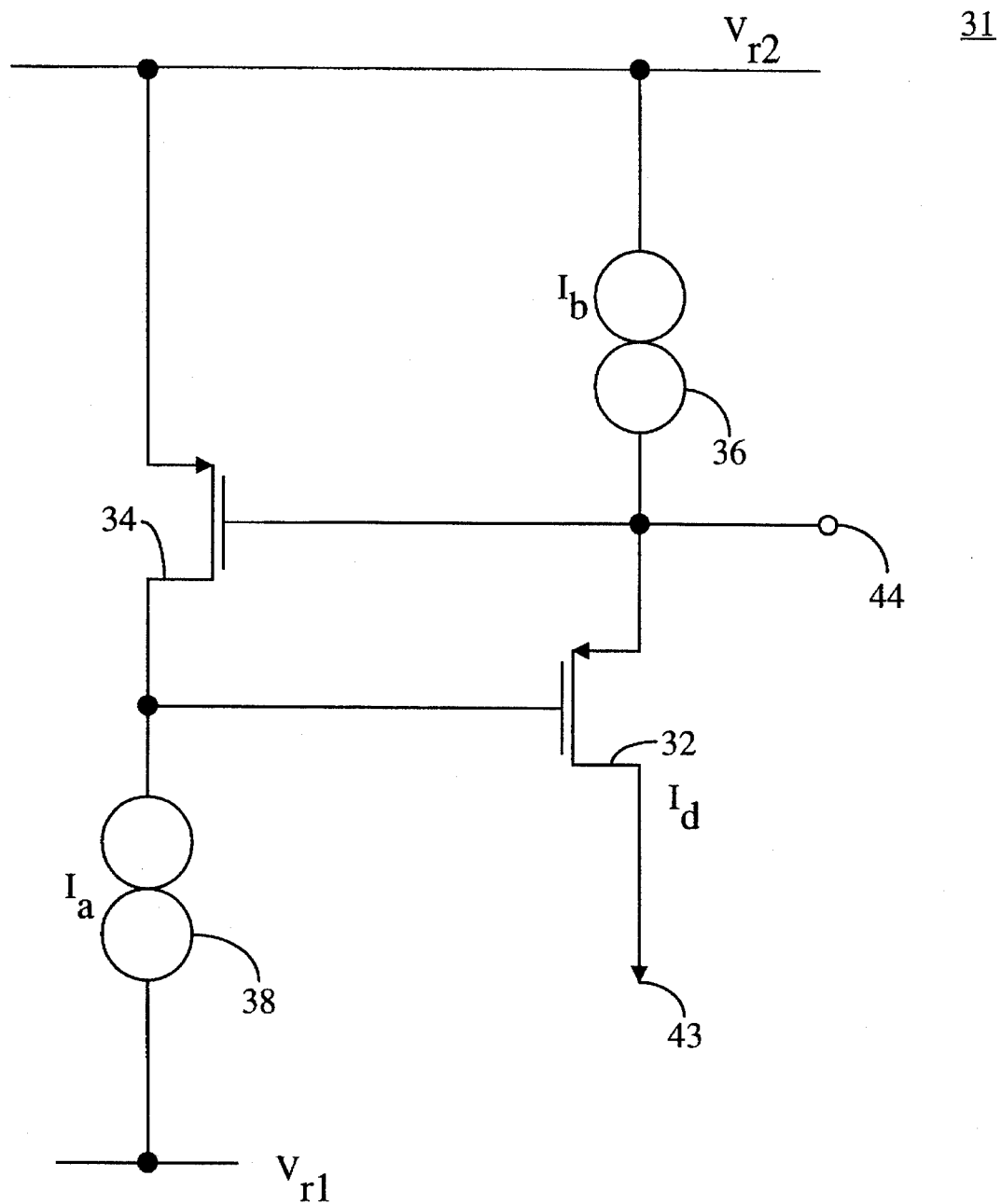
FIG. 3B is a schematic diagram of a P-type modified follower circuit in accordance with the present invention.
Figure 3C:
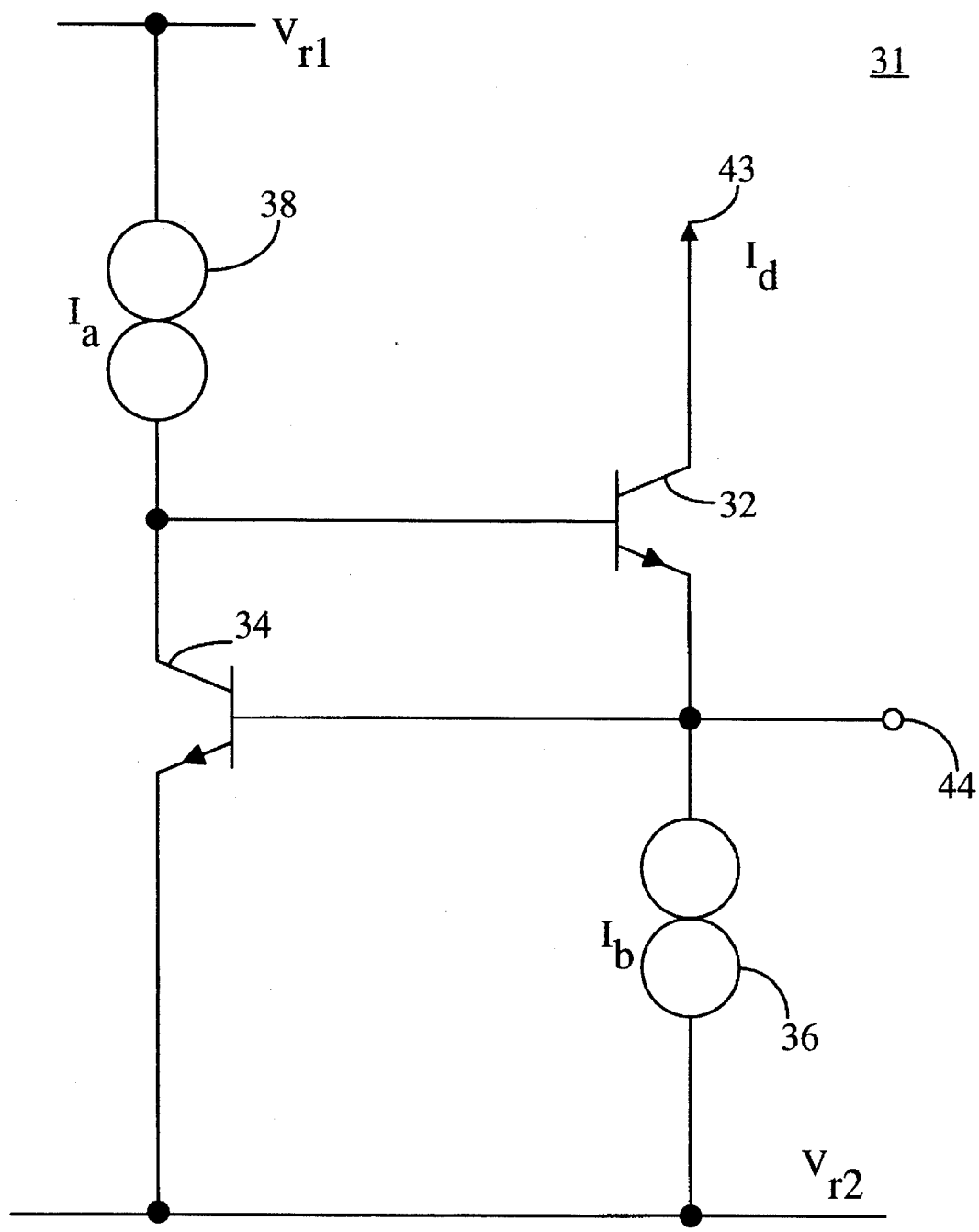
FIG. 3C is a schematic diagram of an N-type modified follower circuit in accordance with the present invention.
Figure 3D:
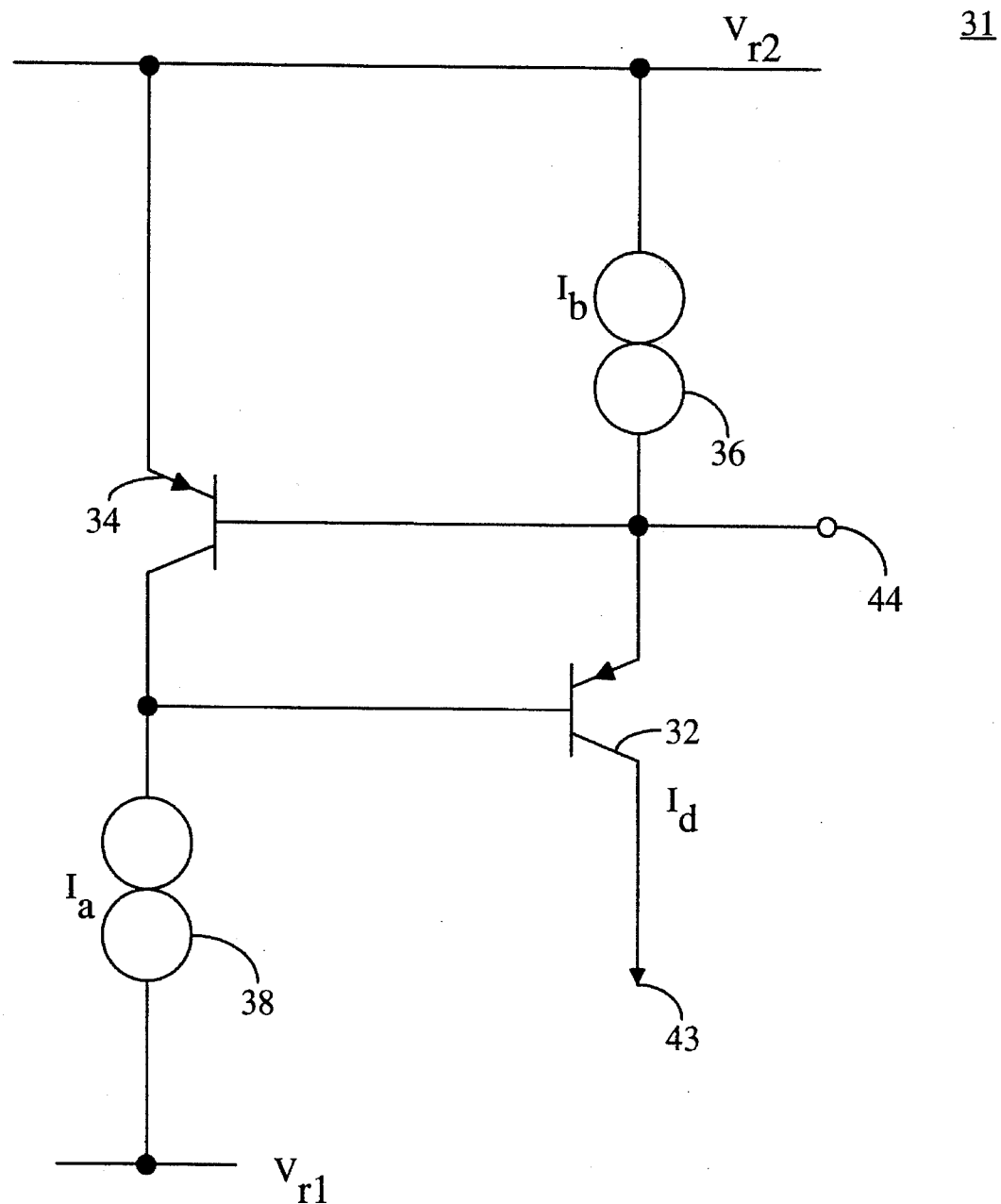
FIG. 3D is a schematic diagram of a P-type modified follower circuit in accordance with the present invention.

Referring now to FIGS. 3B, 3C, and 3D, there are shown modified follower circuits 31 in accordance with the present invention in which both follower transistor 32 and feedback transistors 34 are P-type field effect transistors (FETs), N-type bipolar transistors, and P-type bipolar transistors, respectively. Modified follower circuits 31 in accordance with the present invention may also be realized using biCMOS or other semiconductor technologies. Note that $V_{r1}$ and $V_{r2}$ are reversed for follower circuits based on P-type devices in FIGS. 3B and 3D relative to their positions in follower circuits based on N-type devices in FIGS. 3A and 3C in order to make the relationships between transistor electrodes and reference voltages independent of conductivity type. Modified follower circuits 31 of FIGS. 3A, 3B, 3C, and 3D may be incorporated into folded cascode circuits 10 of appropriate conductivity type where low impedance outputs 44 provide the resulting amplifier with improved gain and bandwidth characteristics.

Figure 3E:
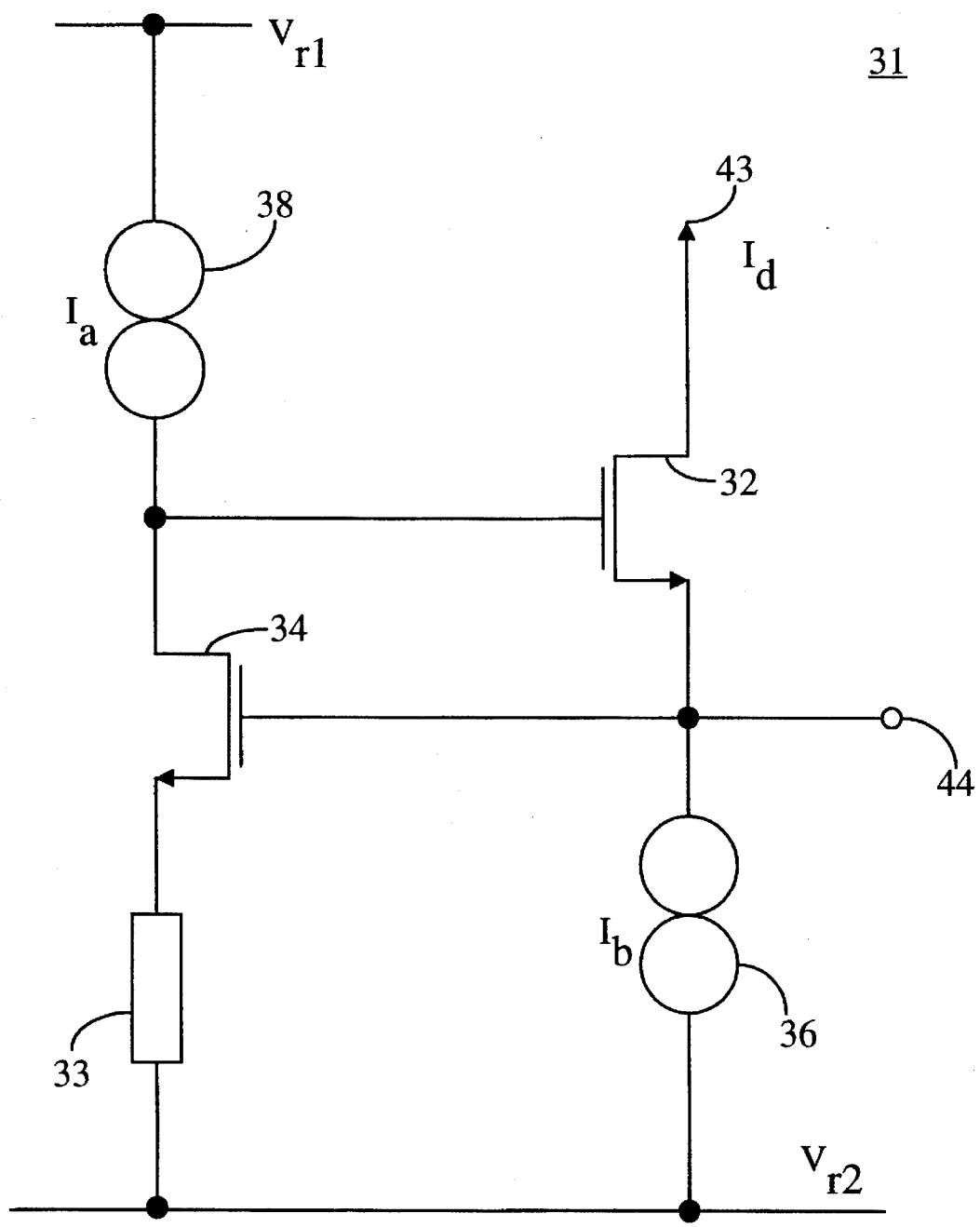
FIG. 3E is A schematic diagram of an N-type modified follower circuit including a device to increase the voltage across the current source at the drain of the follower transistor in accordance with the present invention

Referring now to FIG. 3E, there is shown a variation on modified follower circuit 31 in which a device 33 is connected between the third electrode of feedback transistor 34 and $V_{r2}$ to increase the voltage across current source 36. Device 33 may be, for example, a resistor, a diode, or a voltage source.

Figure 4A:
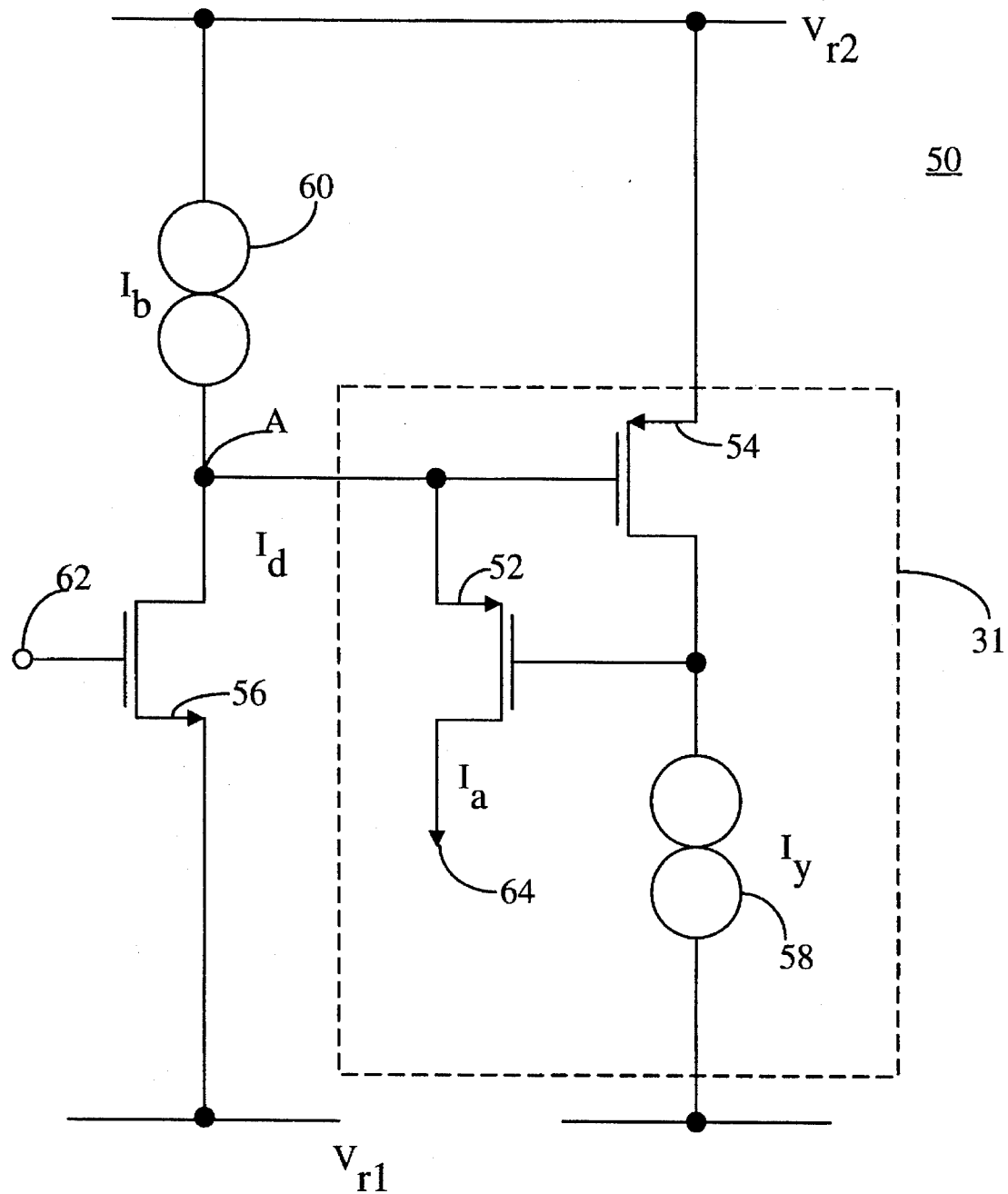
FIG. 4A is a schematic diagram of an active folded cascode circuit in accordance with the present invention in which the follower and feedback transistors are P-type FETs.

Referring now to FIG. 4A, there is shown an active folded cascode circuit 50 in accordance with the present invention, including an amplifier transistor 56 and a modified follower circuit 31 comprising a follower transistor 52, a feedback transistor 54, and a current source 58. Amplifier transistor 56 and follower transistor 52 are connected as a folded cascode, with the second electrode of amplifier transistor 56 and the first electrode of follower transistor 52 forming an input 62 and an output 64, respectively, of active folded cascode circuit 50. The third electrode of amplifier transistor 56 is connected to $V_{r1}$, and the first electrode of amplifier transistor 56 is connected to the output of current source 60 and to the third electrode of follower transistor 52, forming gain node A. As in follower circuit 30 and modified follower circuit 31, feedback transistor 54 has its second electrode and first electrode connected to the third electrode and second electrode, respectively, of follower transistor 52. Current source 58 provides bias current to feedback transistor 54. As with current source 38 of FIGS. 2 and 3A–3E, current source 58 may be as simple as a high value resistor.

With this configuration, the first electrode of feedback transistor 54 provides a bias voltage to the second electrode of follower transistor 52 and the second electrode of feedback transistor 54 holds the third electrode of follower transistor 52 at a voltage $V_{23}$ with respect to $V_{r2}$. The resulting stabilization of the voltage at gain node A reduces the effective third electrode impedance of follower transistor 52 in accordance with Eq. 1, so that the third electrode impedance is substantially less than the impedance of current source 60 in parallel with the first electrode of amplifier transistor 52. Thus, the voltage at node A is not altered due to the finite output impedance of amplifier transistor 56 or current source 60, eliminating the need to cascode the output of current source 60. Further, by eliminating the need for cascode circuitry, node A may be held at a voltage closer to the rail voltage, $V_{DD}$, increasing the compliance of active folded cascode circuit 50.

Active folded cascode circuit 50 has been shown comprising P type follower and feedback transistors 52 and 54, respectively. However, Active folded cascode circuits 50 in accordance with the present invention may also be implemented in N-type FET transistors and in N and P type bipolar transistors by incorporating the appropriate modified follower circuits 31 of FIGS. 3B, 3C, and 3D.

Figure 4B:
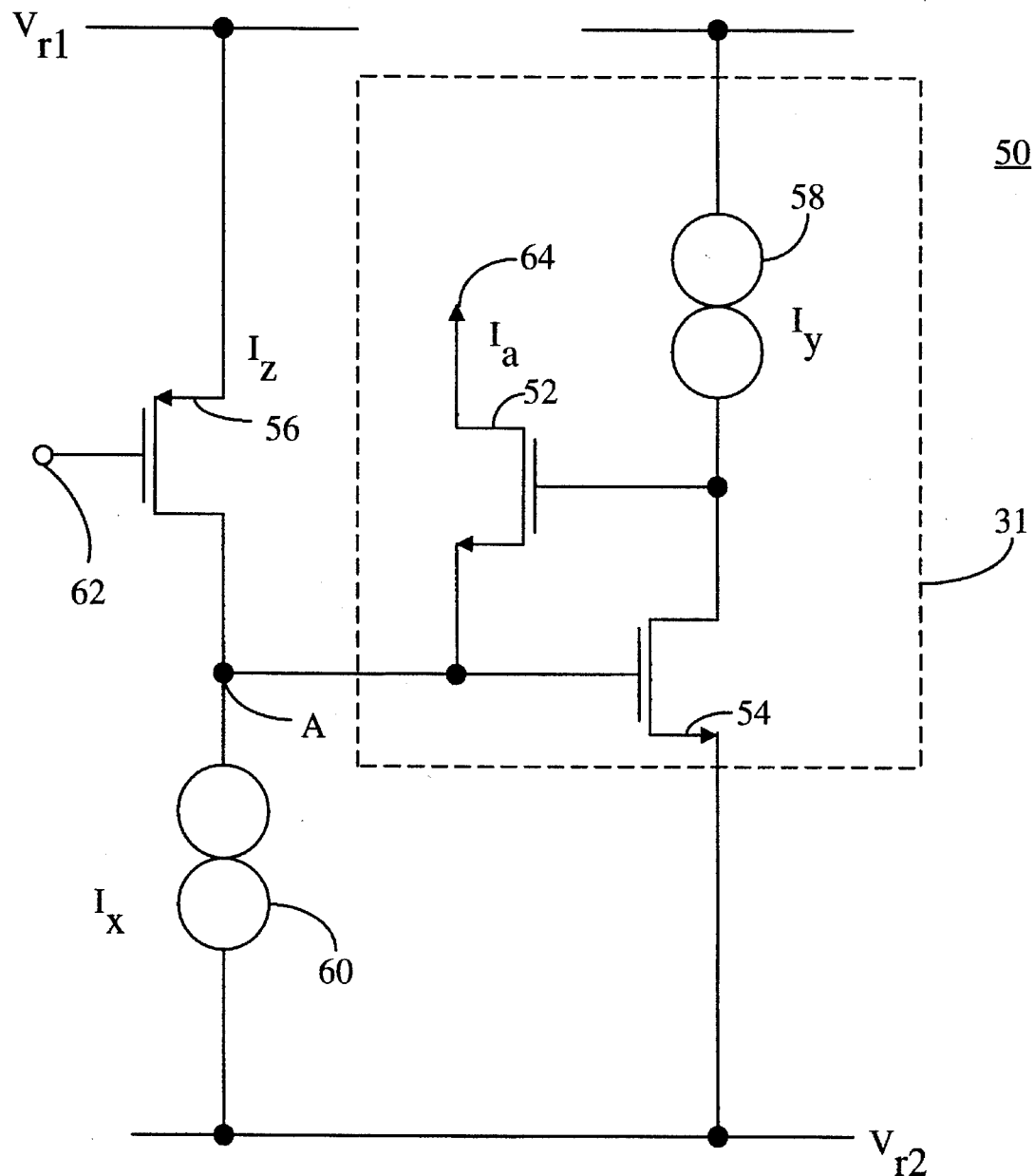
FIG. 4B is a schematic diagram of an active folded cascode circuit in accordance with the present invention in which the follower and feedback transistors are N-type FETs.

Referring now to FIG. 4B, there is shown an active folded cascode circuit 50 in accordance with the present invention in which N-type FET follower and feedback transistors 52 and 54, respectively, are combined with P-type FET amplifier transistor 56.

Figure 4C:
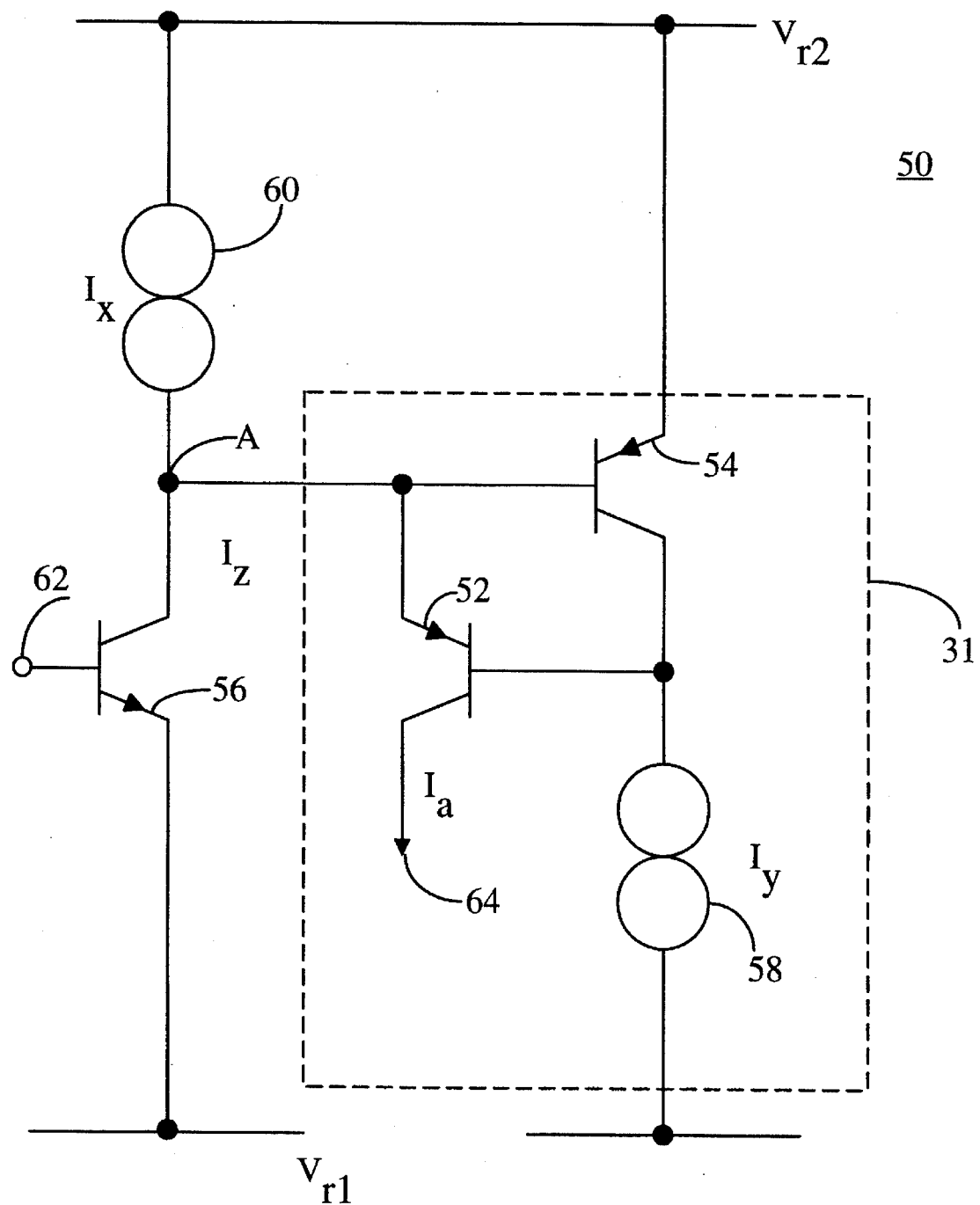
FIG. 4C is a schematic diagram of an active folded cascode circuit in accordance with the present invention in which the follower and feedback transistors are P-type bipolar transistors.

Referring now to FIG. 4C, there is shown an active folded cascode circuit 50 in accordance with the present invention in which P-type bipolar follower and feedback transistors 52 and 54, respectively, are combined with N-type bipolar amplifier transistor 56.

Figure 4D:
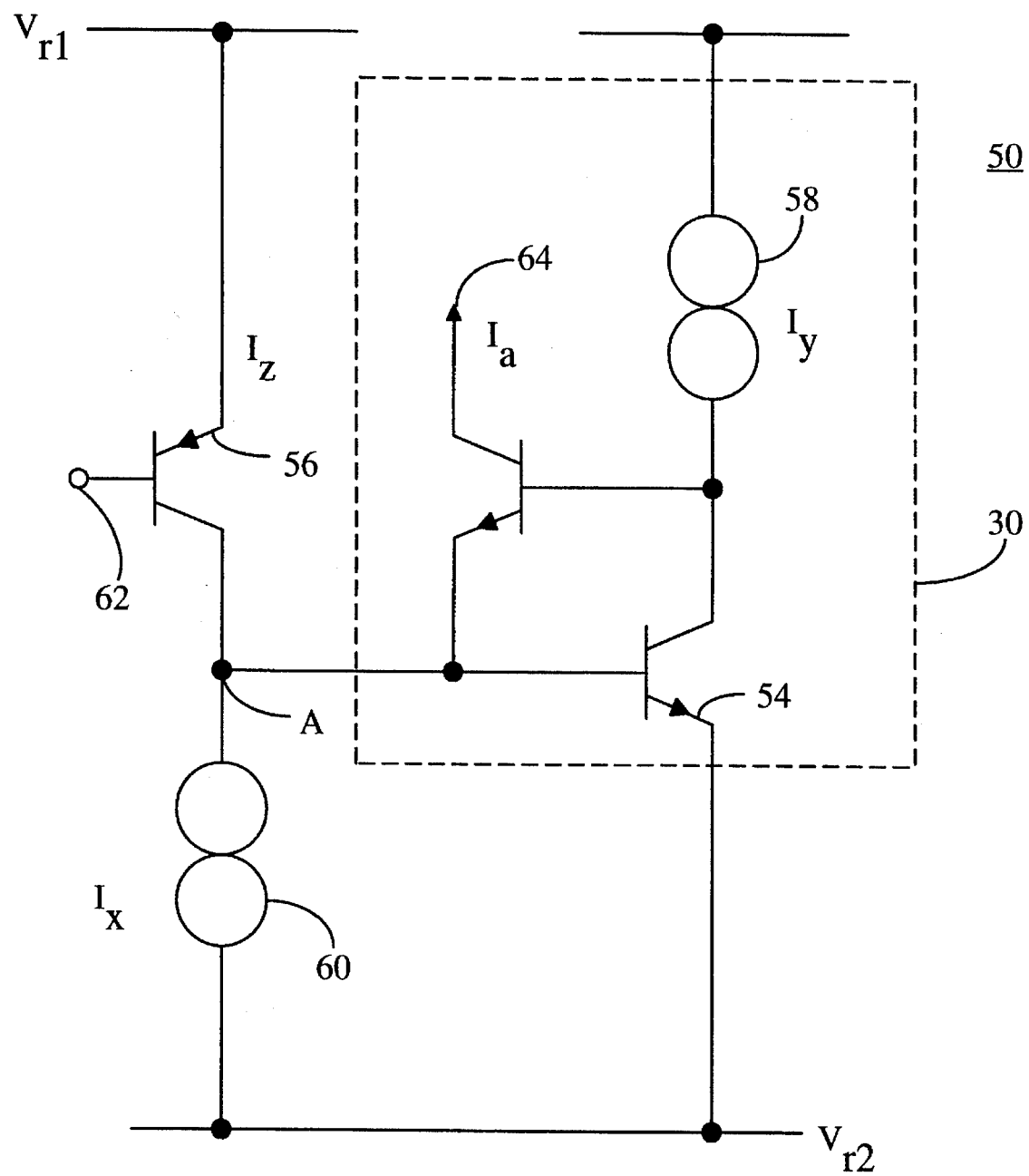
FIG. 4D is a schematic diagram of an active folded cascode circuit in accordance with the present invention in which the follower and feedback transistors are N-type bipolar transistors.

Referring now to FIG. 4D, there is shown an active folded cascode circuit 50 in accordance with the present invention in which N-type bipolar follower and feedback transistors 52 and 54, respectively, are combined with P-type bipolar amplifier transistor 56.

Figure 5A:
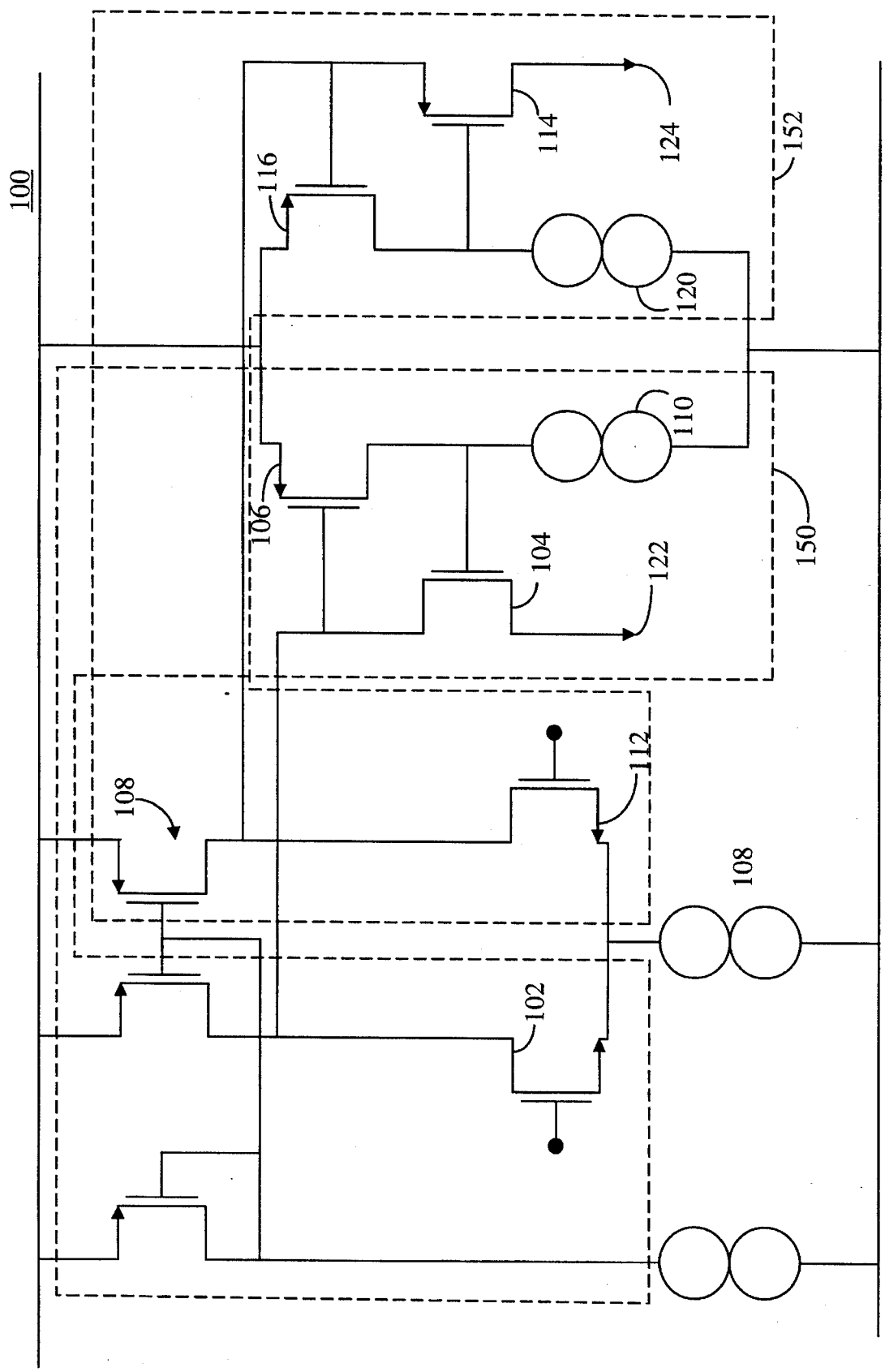
FIG. 5A is a schematic diagram of a differential amplifier employing a P-type active folded cascode implemented using FET transistors in accordance with the present invention.

Referring now to FIG. 5A, there is shown a fully differential, active folded cascode circuit 100 in accordance with the present invention. In differential active cascode circuit 100, amplifier transistor 102, follower transistor 104, and feedback transistor 106 form an active folded cascode circuit 150, while amplifier transistor 112, follower transistor 114, and feedback transistor 116 form a second active folded cascode circuit 152. Second electrodes of amplifier transistors 102, 112 form inputs 101, 111 for differential active folded cascode circuit 100. Current sources 108 provide bias current to amplifier transistors 102, 112 and current sources 110, 120 provide bias current to feedback transistors 106, 116, respectively. Outputs 122 and 124 of active folded cascode circuits 150 and 152, respectively, are formed by the first electrodes of follower transistors 104 and 114.

Figure 5B:
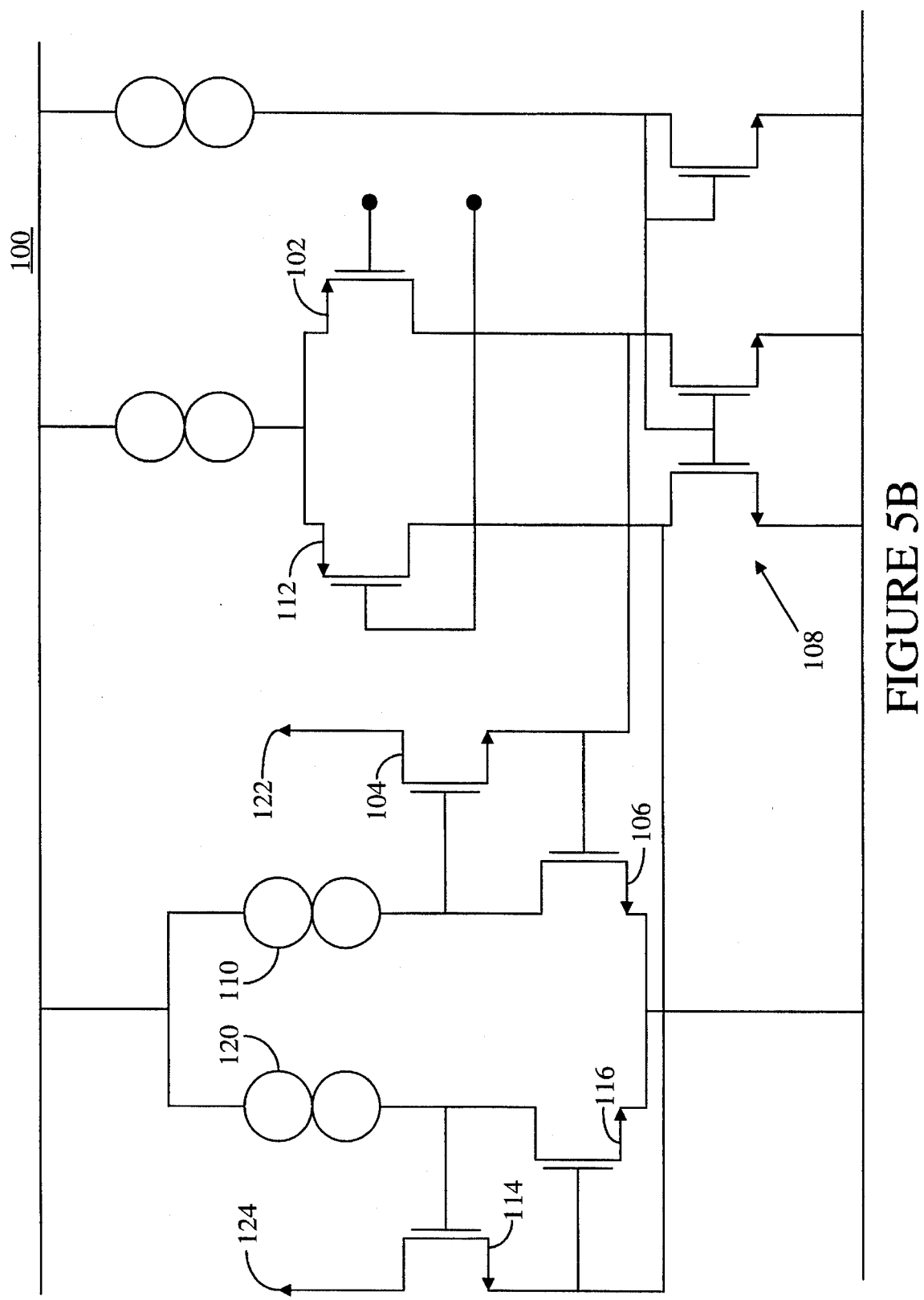
FIG. 5B is a schematic diagram of a differential amplifier employing an N-type active folded cascode implemented using FET transistors in accordance with the present invention.
Figure 5C:
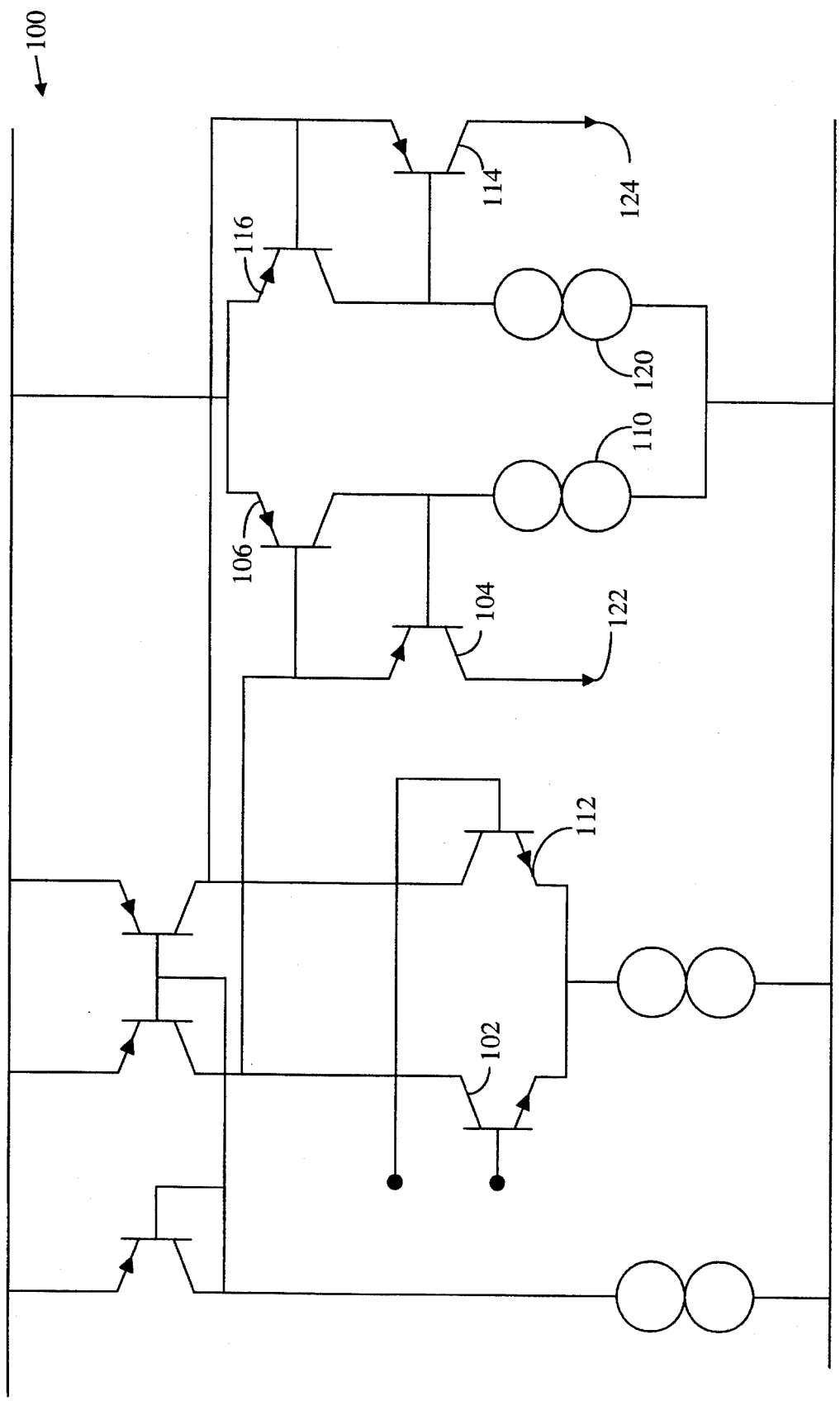
FIG. 5C is a schematic diagram of a differential amplifier employing a P-type active folded cascode implemented using bipolar transistors in accordance with the present invention.
Figure 5D:
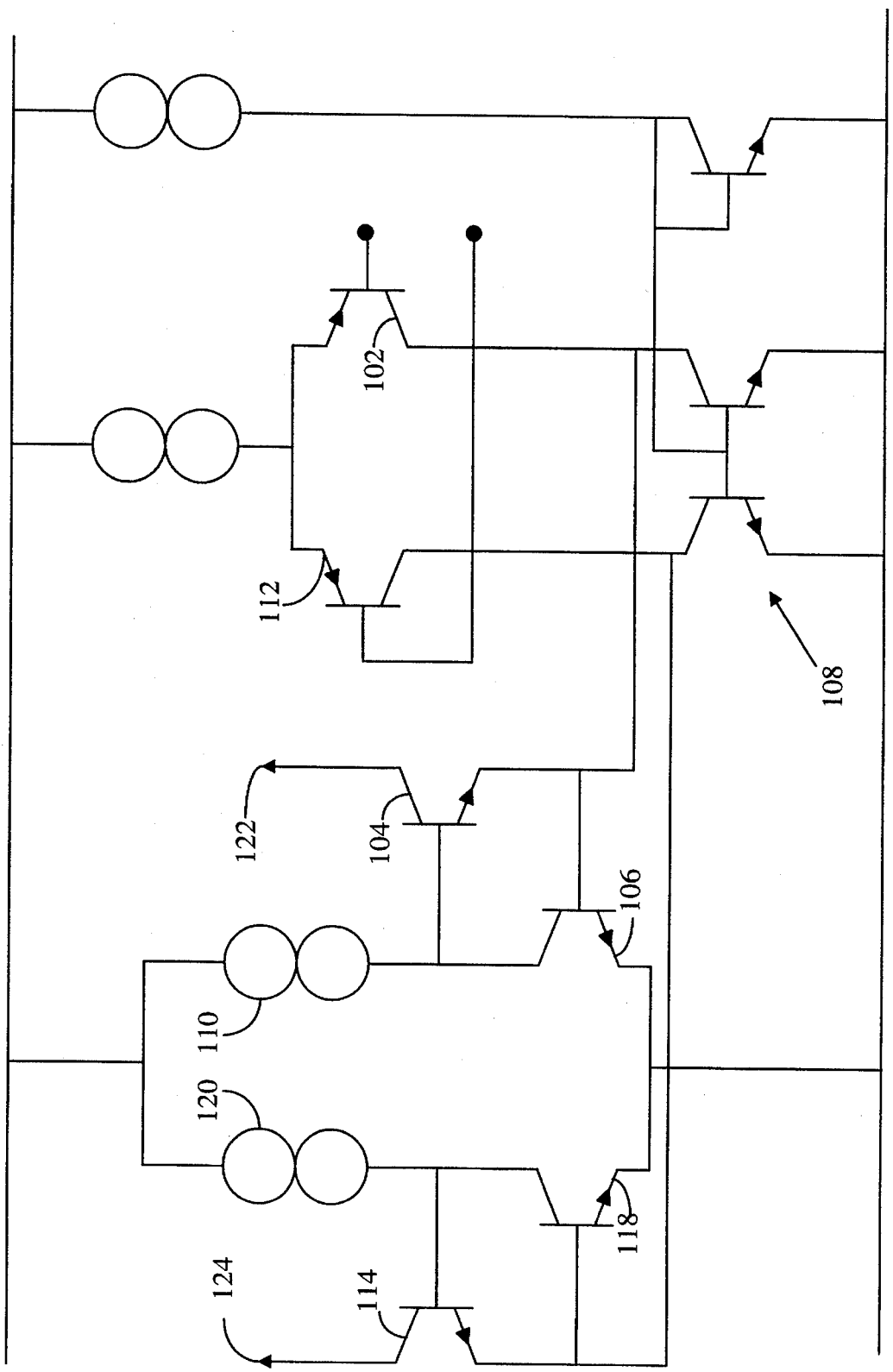
FIG. 5D is a schematic diagram of a differential amplifier employing a N-type active folded cascode implemented using bipolar transistors in accordance with the present invention.

Referring now to FIGS. 5B, 5C, and 5D, there are shown differential active folded cascode circuits 100 in accordance with the present invention, wherein feedback transistors 106, 116 and follower transistors 104, 114 are N-type FETs, P-type bipolar transistors, and N-type bipolar transistors.

Therefore, modified follower circuits 31 that use feedback to reduce the impedance of the input 44 formed by the third electrode of follower transistor 32 are presented in accordance with the present invention. Also presented are active folded cascode circuits 50, 100 which incorporate modified follower circuits 31 to provide active folded cascode amplifier circuits having improved gain and bandwidth properties.

What is claimed is:

1. An active folded cascode circuit having improved impedance, gain, and bandwidth properties, the active folded cascode circuit comprising:

first and second reference voltages;

an amplifier transistor having first, second, and third electrodes, the first electrode forming a gain node, the second electrode forming an input of the active folded cascode circuit, and the third electrode being connected to the second reference voltage;

a follower transistor having first, second, and third electrodes, the third electrode being connected to the gain node and the first electrode forming an output of the active folded cascode circuit;

a feedback transistor having first, second, and third electrodes, the first and second electrodes being connected to the second and third electrodes, respectively, of the follower transistor, and the third electrode being connected to the first reference voltage;

a first current source connected to the first electrode of the amplifier transistor, for providing bias current to the amplifier transistor and output current to the follower transistor, according to a signal applied to the input of the active folded cascode circuit; and a second current source connected to the first electrode of the feedback transistor to provide bias current to the feedback transistor; the biased feedback transistor maintaining the third electrode of the follower circuit at a fixed voltage relative to the first reference voltage and coupling the voltage at the third electrode of the follower transistor to the second electrode of the follower transistor to reduce the impedance of the gain node of the active folded cascode circuit.

2. The active folded cascode circuit of claim 1, wherein the amplifier transistor is an N-type bipolar transistor, the follower and feedback transistors are P-type bipolar transistors, and the first, second and third electrodes correspond to collector, base, and emitter electrodes.

3. The active folded cascode circuit of claim 1, wherein the amplifier transistor is a P-type bipolar transistor, the follower and feedback transistor are N-type bipolar transistor, and the first, second, and third electrodes correspond to collector, base, and emitter electrodes.

4. The active folded cascode circuit of claim 1, wherein the amplifier transistor is an N-type FET, the follower and feedback transistors are P-type FETs, and the first, second and third electrodes correspond to drain, gate, and source electrodes.

5. The active folded cascode circuit of claim 1, wherein the amplifier transistor is a P-type FET, the follower and feedback transistors are N-type FETs, and the first, second and third electrodes correspond to drain, gate, and source electrodes.

6. The active folded cascode circuit of claim 1, further comprising a second active folded cascode circuit, the third electrodes of the amplifier transistors of each active folded cascode circuit being coupled together to form a differential input amplifier, the second electrodes of the amplifier transistors forming a pair of differential inputs and the first electrodes of the follower transistors forming a pair of differential outputs, the pair of active folded cascode circuits forming a differential active folded cascode circuit.

7. The active folded cascode circuit of claim 6, wherein the amplifier transistors are N-type bipolar transistors, the follower and feedback transistors are P-type bipolar transistors, and the first, second, and third electrodes are collector, base, and emitter electrodes.

8. The active folded cascode circuit of claim 6, wherein the amplifier transistors are P-type bipolar transistor, the follower and feedback transistors are N-type bipolar transistors, and the first, second, and third electrodes are collector, base, and emitter electrodes.

9. The active folded cascode circuit of claim 6, wherein the amplifier transistors are N-type FETs, the follower and feedback transistors are P-type FETs, and the first, second, and third electrodes are drain, gate, and source electrodes.

10. The active folded cascode circuit of claim 6, wherein the amplifier transistors are P-type FETs, the follower and feedback transistors are N-type FETs, and the first, second, and third electrodes are drain, gate, and source electrodes.

* * * * *